(12) United States Patent
Nagase et al.

(10) Patent No.: US 9,147,861 B2
(45) Date of Patent: Sep. 29, 2015

(54) SURFACE LIGHT-EMITTING OBJECT

(75) Inventors: Junichi Nagase, Ibaraki (JP); Kazuhito Hosokawa, Ibaraki (JP); Takahiro Nakai, Ibaraki (JP); Shigenori Morita, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 99 days.

(21) Appl. No.: 13/985,841

(22) PCT Filed: Jan. 11, 2012

(86) PCT No.: PCT/JP2012/050315
§ 371 (c)(1),
(2), (4) Date: Aug. 15, 2013

(87) PCT Pub. No.: WO2012/111361
PCT Pub. Date: Aug. 23, 2012

(65) Prior Publication Data
US 2013/0320325 A1 Dec. 5, 2013

(30) Foreign Application Priority Data
Feb. 17, 2011 (JP) ................................. 2011-031573

(51) Int. Cl.
*H01L 29/08* (2006.01)
*H01L 51/52* (2006.01)
*G02B 3/00* (2006.01)
*G02B 5/02* (2006.01)
(Continued)

(52) U.S. Cl.
CPC ............ *H01L 51/5275* (2013.01); *G02B 3/005* (2013.01); *G02B 5/02* (2013.01); *H01L 27/32* (2013.01); *H05B 33/10* (2013.01); *H01L 2251/5361* (2013.01)

(58) Field of Classification Search
CPC ....................................................... H01L 51/50
See application file for complete search history.

(56) References Cited

U.S. PATENT DOCUMENTS 7,837,343 B2    11/2010   Shibasaki et al.
7,969,463 B2     6/2011   Takaki
(Continued)

FOREIGN PATENT DOCUMENTS

CN     101087488 A    12/2007
JP     H10223367 A     8/1998
(Continued)

OTHER PUBLICATIONS

Intellectual Property Office of Taiwan, Office Action Issued in Taiwan Patent Application No. 101104091, Sep. 26, 2014, 7 pages.
(Continued)

*Primary Examiner* — Long K Tran
(74) *Attorney, Agent, or Firm* — Alleman Hall McCoy Russell & Tuttle LLP

(57) ABSTRACT

A surface light emitter according to an embodiment of the present invention, includes: a base material; a plurality of ribbon-shaped organic electroluminescent elements provided side by side on the base material; and a lenticular sheet that is attached to the base material and the ribbon-shaped organic electroluminescent elements through an adhesion layer, and that has a plurality of convex cylindrical lenses provided side by side. A direction in which the convex cylindrical lenses extend and a direction in which the ribbon-shaped organic electroluminescent elements extend are substantially parallel to each other.

8 Claims, 4 Drawing Sheets

(51) Int. Cl.
  *H01L 27/32* (2006.01)
  *H05B 33/10* (2006.01)

(56) References Cited

U.S. PATENT DOCUMENTS

| | | | |
|---|---|---|---|
| 2004/0189185 A1* | 9/2004 | Yotsuya | 313/501 |
| 2007/0188517 A1 | 8/2007 | Takaki | |
| 2007/0285410 A1 | 12/2007 | Shibasaki et al. | |
| 2011/0012139 A1* | 1/2011 | Yamamoto | 257/88 |

FOREIGN PATENT DOCUMENTS

| | | |
|---|---|---|
| JP | 2000322000 A | 11/2000 |
| JP | 2002170663 A | 6/2002 |
| JP | 2002538502 A | 11/2002 |
| JP | 2005309374 A | 11/2005 |
| JP | 2005122646 A1 | 12/2005 |
| JP | 2006318807 A | 11/2006 |
| JP | 2007328986 A | 12/2007 |
| JP | 2009001784 A | 1/2009 |
| JP | 2009272068 A | 11/2009 |
| JP | 2010040427 A | 2/2010 |
| JP | 2010231010 A | 10/2010 |
| TW | 200817790 A | 4/2008 |
| WO | 0051192 A1 | 8/2000 |

OTHER PUBLICATIONS

Japanese Patent Office, Notification of Reason for Refusal of Japanese Patent Application No. 2011031573, Sep. 12, 2012, Japan, 6 pages.
ISA Japan, International Search Report of PCT/JP2012/050315, Jan. 11, 2012, WIPO, 2 pages.
State Intellectual Property Office of the People's Republic of China, First Office Action Issued in Chinese Patent Application No. 201280008980.9, Apr. 1, 2015, 14 pages.

* cited by examiner

SURFACE LIGHT-EMITTING OBJECT

TECHNICAL FIELD

The present invention relates to a surface light emitter. More specifically, the present invention relates to a surface light emitter using a ribbon-shaped organic electroluminescent element and a lenticular sheet.

BACKGROUND

An organic electroluminescent (EL) light-emitting apparatus has been expected to find use in a wide variety of applications such as lighting equipment, a backlight for a liquid crystal display apparatus, a light-emitting part for display decoration, and a digital signage because of the following reasons. The power consumption of the apparatus is low. In addition, the apparatus is self-luminous by virtue of organic light-emitting materials and develops various colors derived from the organic light-emitting materials. Further, it has been known that the organic EL light-emitting apparatus is suitable for lighting applications because the apparatus is surface light-emitting. An organic EL light-emitting apparatus must be able to be increased in size, reduced in cost, and mass produced in order for such apparatus to be adopted for practical uses. A technology involving using a plurality of fibrous substrates in tandem instead of increasing the size of a substrate itself has been proposed as an attempt to achieve the increase in size (for example, Patent Literature 1). A technology involving employing the so-called roll-to-roll process has been proposed as an attempt to achieve reductions in cost (for example, Patent Literature 2).

Each of the technologies described in the patent literatures involves providing elongated organic EL elements side by side. However, when the elongated organic EL elements are provided side by side, a pattern in which the organic EL elements are provided side by side appears in planar illumination or a display image. As a result, the following problems arise. Luminance unevenness is large, and the quality of each of the illumination and the display is insufficient.

CITATION LIST

Patent Literature

[PTL 1] JP 2002-538502 A
[PTL 2] JP 2005-122646 A1

SUMMARY OF INVENTION

Technical Problem

The present invention has been made to solve the above-mentioned conventional problems, and an object of the present invention is to provide a surface light emitter that can be mass-produced at a low cost and exhibits small luminance unevenness.

Solution to Problem

A surface light emitter according to an embodiment of the present invention, includes: a base material; a plurality of ribbon-shaped organic electroluminescent elements provided side by side on the base material; and a lenticular sheet that is attached to the base material and the ribbon-shaped organic electroluminescent elements through an adhesion layer, and that has a plurality of convex cylindrical lenses provided side by side. A direction in which the convex cylindrical lenses extend and a direction in which the ribbon-shaped organic electroluminescent elements extend are substantially parallel to each other.

In one embodiment of the present invention, an interval X (mm) between adjacent elements in the plurality of ribbon-shaped organic electroluminescent elements, and a total thickness Y (mm) of the lenticular sheet and the adhesion layer satisfy the following expression (1):

$$Y \geq (\sqrt{3}/2) \times X \qquad (1).$$

Advantageous Effects of the Invention

According to the present invention, the surface light emitter, which can be mass-produced at a low cost and exhibits small luminance unevenness, can be obtained by integrating ribbon-shaped organic EL elements placed side by side and a lenticular sheet so that the direction in which cylindrical lenses extend and the direction in which the ribbon-shaped organic EL elements extend may be substantially parallel to each other.

DESCRIPTION OF EMBODIMENTS

Hereinafter, a preferred embodiment of the present invention is described. However, the present invention is not limited to such embodiment.

A. Entire Construction of Surface Light Emitter

Figure 1:
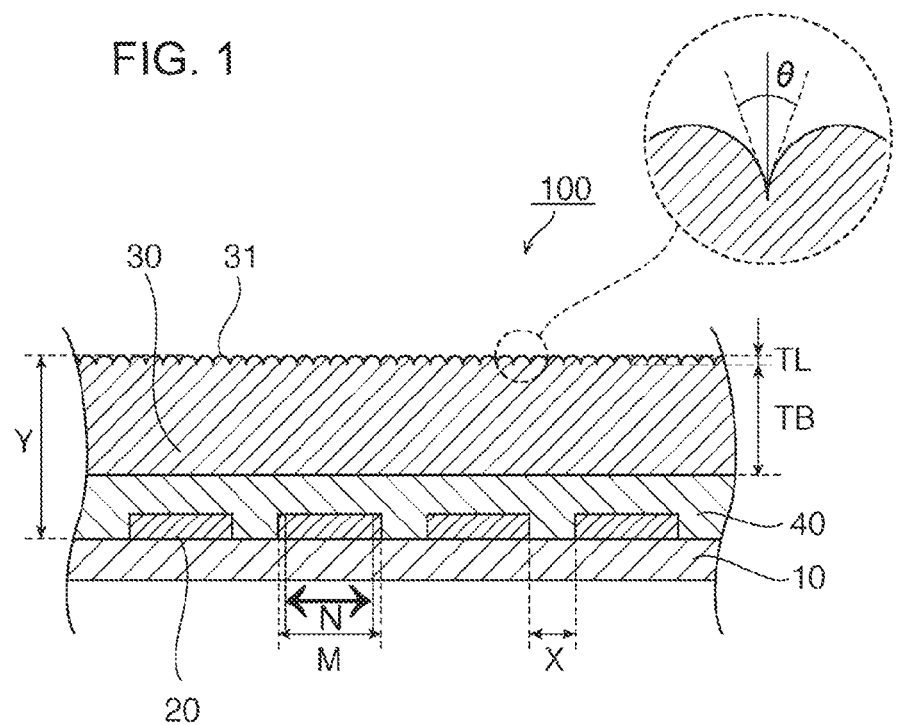
FIG. 1 is a schematic sectional view of a surface light emitter according to a preferred embodiment of the present invention.
Figure 2:
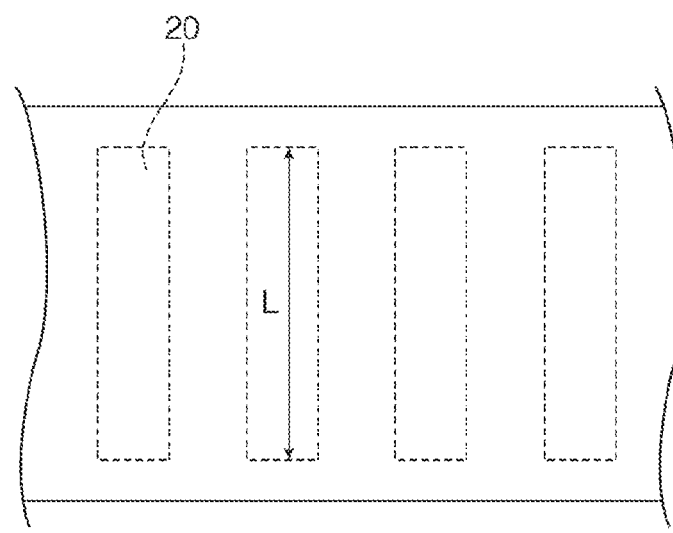
FIG. 2 is a schematic plan view of the surface light emitter of FIG. 1 viewed from a lenticular sheet side.

FIG. 1 is a schematic sectional view of a surface light emitter according to the preferred embodiment of the present invention. FIG. 2 is a schematic plan view of the surface light emitter of FIG. 1 viewed from a lenticular sheet side. It should be noted that a ratio among, for example, a length, a width, and a thickness in each of the figures is different from reality for illustration purposes. A surface light emitter 100 includes: a base material 10; a plurality of ribbon-shaped organic electroluminescent (EL) elements 20 provided side by side (i.e., in a stripe manner) on the base material 10; and a lenticular sheet 30. The base material 10 is typically a glass plate. The lenticular sheet 30 has a plurality of convex cylindrical lenses 31 provided side by side (i.e., in a stripe manner). Each of the convex cylindrical lenses 31 typically has a semicircular sectional shape. The lenticular sheet 30 is integrated by being attached to the base material 10 and the ribbon-shaped organic EL elements 20 through an adhesion layer 40. In the surface light emitter of the present invention, the direction in which the convex cylindrical lenses 31 extend and the direction in which the ribbon-shaped organic EL elements 20 extend are substantially parallel to each other. The phrase "substantially parallel" as used herein includes the case where an angle formed between the two directions (here, an angle formed between the direction in which the convex cylindrical lenses 31 extend and the direction in which the ribbon-shaped organic EL elements 20 extend) is 0°±2.0°, and the angle is preferably 0°±1.0°, more preferably 0°±0.5°.

The width of each of the convex cylindrical lenses 31 (corresponding to the diameter of the semicircular section) is smaller than a width M of each organic EL element. For example, 150 to 250 convex cylindrical lenses are preferably placed at a position corresponding to each of the ribbon-shaped organic EL elements 20. For example, a ratio of the width of each of the convex cylindrical lenses 31 to the width of each organic EL element is preferably 1/10 to 1/10,000, more preferably 1/20 to 1/5,000. With such construction, light beams from the organic EL elements can be satisfactorily caused to interfere with each other to be emitted to a front surface. Accordingly, the stripe pattern can be eliminated and sufficient brightness can be realized.

An interval (i.e., a pitch of the ribbon-shaped organic EL elements) X (mm) between adjacent elements in the plurality of ribbon-shaped organic EL elements, and a total thickness Y (mm) of the lenticular sheet and the adhesion layer satisfy preferably the following expression (1), more preferably, the following expression (2):

$$Y \geq (\sqrt{3}/2) \times X \quad (1)$$

$$Y \geq X \quad (2).$$

When the pitch of the ribbon-shaped organic EL elements, and the total thickness of the lenticular sheet and the adhesion layer satisfy such a relationship, the light beams from the respective ribbon-shaped organic EL elements can appropriately interfere with each other by virtue of the lenticular sheet to eliminate the stripe pattern. As a result, luminance unevenness can be suppressed in an extremely satisfactory manner. The pitch X of the ribbon-shaped organic EL elements can vary depending on, for example, the width of each ribbon-shaped organic EL element, and the total thickness of the lenticular sheet and the adhesion layer. For example, the pitch X of the ribbon-shaped organic EL elements is preferably 1 mm to 10 mm. It should be noted that as is apparent from FIG. 1, the pitch X of the ribbon-shaped organic EL elements means a distance between the adjacent end portions of adjacent organic EL elements (i.e., a distance between the right end portion of a left organic EL element and the left end portion of a right organic EL element), and the total thickness Y of the lenticular sheet and the adhesion layer means a distance from the apex of each convex cylindrical lens to the surface of the base material on the side where the organic EL elements are provided.

B. Ribbon-Shaped Organic EL Elements

Figure 3:
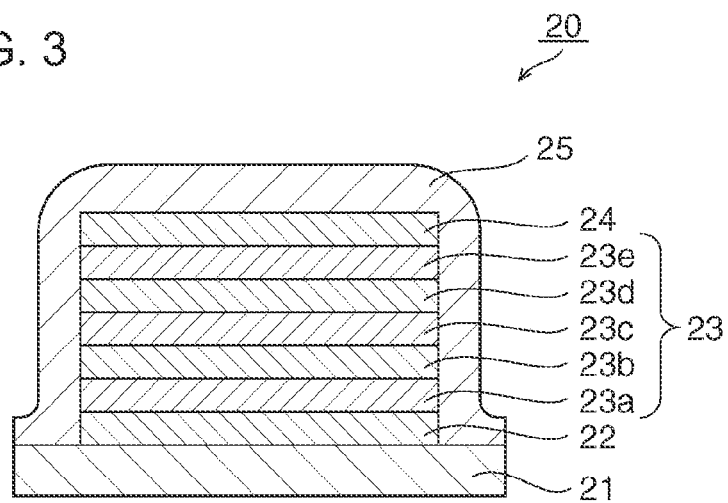
FIG. 3 is a schematic sectional view illustrating an embodiment of a ribbon-shaped organic EL element to be used in the present invention.

Any appropriate ribbon-shaped organic EL element can be adopted as each of the ribbon-shaped organic EL elements 20 as long as an effect of the present invention is obtained. FIG. 3 is a schematic sectional view illustrating an embodiment of the ribbon-shaped organic EL element to be used in the present invention. The ribbon-shaped organic EL element 20 typically has a substrate 21, a first electrode 22, an organic EL layer 23, a second electrode 24, and an encapsulating layer 25 for covering these layers. The ribbon-shaped organic EL element 20 can further have any appropriate layer as required. For example, a planarizing layer (not shown) may be provided on the substrate, or an insulating layer (not shown) for preventing a short circuit may be provided between the first electrode and the second electrode.

The substrate 21 can be formed of any appropriate material as long as the effect of the present invention is obtained. The substrate 21 is typically formed of a material having barrier property. Such substrate can protect the organic EL layer 23 from oxygen and moisture. Further, the substrate 21 is preferably formed of a material having flexibility. The use of the substrate having flexibility enables the production of the organic EL element by the so-called roll-to-roll process, and hence can realize a low cost and mass production. Specific examples of the material having barrier property and flexibility include a thin glass provided with flexibility, a thermoplastic resin or thermosetting resin film provided with barrier property, an alloy, and a metal. Examples of the thermoplastic resin or the thermosetting resin include a polyester-base resin, a polyimide-based resin, an epoxy-based resin, a polyurethane-based resin, a polystyrene-based resin, a polyolefin-based resin, a polyamide-based resin, a polycarbonate-based resin, a silicone-based resin, a fluororesin, and an acrylonitrile-butadiene-styrene copolymer resin. Examples of the alloy include stainless steel, 36 alloy, and 42 alloy. Examples of the metal include copper, nickel, iron, aluminum, and titanium. The thickness of the substrate is preferably 5 μm to 500 μm, more preferably 5 μm to 200 μm, still more preferably 10 μm to 300 μm. When the substrate has such thickness, the substrate is excellent in balance among its flexibility, handleability, and mechanical strength, and can be suitably used in the roll-to-roll process.

The first electrode 22 can typically function as an anode. In this case, a material for constituting the first electrode is preferably a material having a large work function from the viewpoint of improving a hole-injecting property. Specific examples of such material include: transparent conductive materials such as indium tin oxide (ITO), indium zinc oxide (IZO), indium tin oxide doped with silicon oxide (ITSO), indium oxide containing tungsten oxide (IWO), indium zinc oxide containing tungsten oxide (IWZO), indium oxide containing titanium oxide (ITiO), indium tin oxide containing titanium oxide (ITTiO), and indium tin oxide containing molybdenum (ITMO); and metals such as gold, silver, platinum, and alloys thereof.

The organic EL layer 23 is a laminate including various organic thin films. In the illustrated example, the organic EL layer 23 has: a hole-injecting layer 23a formed of a hole-injectable organic material (such as a triphenylamine derivative) and provided for improving the efficiency of the injection of a hole from the anode; a hole-transporting layer 23b formed of, for example, copper phthalocyanine; a light-emitting layer 23c formed of a luminous organic substance (such as anthracene, bis[N-(1-naphthyl)-N-phenyl]benzidine, or N,N'-diphenyl-N—N-bis(1-naphthyl)-1,1'-(biphenyl)-4,4'-diamine (NPB)); an electron-transporting layer 23d formed of, for example, an 8-quinolinol aluminum complex; and an electron-injecting layer 23e formed of an electron-injectable material (such as a perylene derivative or lithium fluoride) and provided for improving the efficiency of the injection of an electron from a cathode. The organic EL layer 23 is not limited to the illustrated example, and any appropriate combination in which an electron and a hole can recombine in the light-emitting layer 23c to cause light emission can be adopted. The thickness of the organic EL layer 23 is preferably as small as possible. This is because it is preferable to transmit as much of the emitted light as possible. The organic EL layer 23 can be formed of an extremely thin laminate having a thickness of, for example, 5 nm to 200 nm, preferably about 10 nm.

The second electrode 24 can typically function as the cathode. In this case, a material for constituting the second electrode is preferably a material having a small work function from the viewpoint of facilitating electron injection to improve luminous efficiency. Specific examples of such material include aluminum, magnesium, and alloys thereof.

The encapsulating layer 25 is formed of any appropriate material. The encapsulating layer 25 is preferably formed of a material excellent in a barrier property and transparency. Typical examples of the material for constituting the encapsulating layer include an epoxy resin and a polyurea. In one embodiment, the encapsulating layer 25 may be formed by applying an epoxy resin (typically an epoxy resin adhesive) and attaching a barrier sheet onto the resin.

Any appropriate size of each of the ribbon-shaped organic EL elements 20 can be adopted depending on the function and application. For example, the width M of each of the ribbon-shaped organic EL elements 20 is approximately in the range of 5 mm to 100 mm, its length L is approximately in the range of 50 mm to 2,000 mm, and a width N of its light-emitting portion (substantially the organic EL layer) is approximately in the range of 50% to 95% of the width M.

Figure 4:
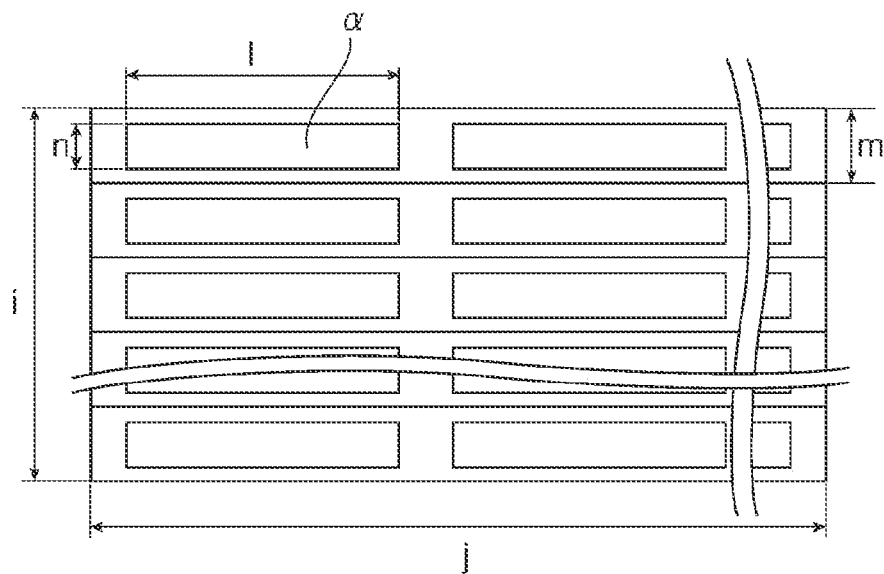
FIGS. 4(a)-4(c) are each a schematic view illustrating an example of a production procedure for the ribbon-shaped organic EL element to be used in the present invention.
Figure 4:
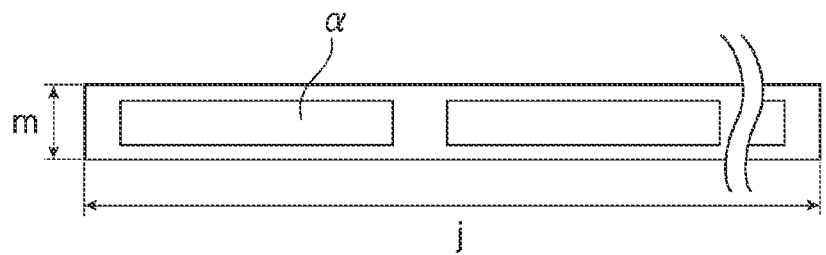
Figure 4:
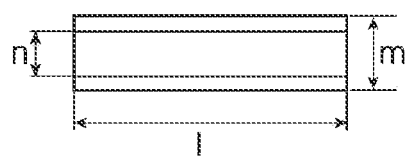

The ribbon-shaped organic EL elements 20 can be preferably produced by the roll-to-roll process in a continuous manner. A typical production procedure is as described below. In the following example, the case where both the planarizing layer and the insulating layer are formed is described. First, as illustrated in FIG. 4(a), a long, flexible glass thin plate (having, for example, a width i of 3 m and a length j of 140 m) is prepared as the substrate. An insulating material (such as a JEM-477 manufactured by JSR Corporation) is applied onto the glass thin plate and then dried, followed by its post-baking at, for example, 220° C. for 1 hour to form the planarizing layer having a predetermined thickness. Next, the first electrode is formed on the glass thin plate with a long sputtering apparatus.

Next, the insulating layer is formed on the first electrode by opening a portion ($\alpha$) (having, for example, a width n of 20 mm and a length l of 100 mm) where the organic EL layer is to be formed in a subsequent step. Specifically, the formation of the insulating layer is performed by applying a photosensitive insulating material, exposing the material through a photomask having a predetermined pattern corresponding to the opening portion ($\alpha$), and developing the material. After the formation of the insulating layer, the laminate is cut in its lengthwise direction with a laser or the like so as to have a predetermined width. Thus, such a long ribbon-shaped laminate (having, for example, a width m of 22 mm and a length j of 140 m) as illustrated in FIG. 4(b) is obtained.

The organic EL layer is formed in the opening portion ($\alpha$) of the long ribbon-shaped laminate obtained in the foregoing by a vacuum deposition method. Further, the second electrode is continuously formed in a vacuum. Next, the first electrode, the organic EL layer, and the second electrode thus formed are encapsulated, and then the resultant laminate is cut every predetermined length to provide such a ribbon-shaped organic EL element (having, for example, a width m of 22 mm and a length l of 100 mm) as illustrated in FIG. 4(c). Such production method enables production at a low cost because the method enables the continuous production of the organic EL elements by the roll-to-roll process. Further, after the formation of the first electrode (and the insulating layer as required), the wide substrate is cut into the predetermined width to be of the long ribbon shape and then the organic EL element is formed in the long ribbon-shaped laminate, followed by cutting into the predetermined length. Accordingly, production efficiency is extremely good. Further, when the insulating layer is formed, the shape (or size) of the organic EL layer can be controlled by patterning the opening portion corresponding to the shape of the organic EL layer. In addition, such production method can suppress a cost for the introduction of production facilities because the method does not require any special production apparatus.

Finally, the ribbon-shaped organic EL elements thus obtained are attached onto the base material at a predetermined pitch so as to be substantially parallel to each other, and then the lenticular sheet is attached thereon. Thus, the surface light emitter of the present invention can be obtained.

C. Lenticular Sheet

Any appropriate lenticular sheet can be adopted as the lenticular sheet 30 as long as the effect of the present invention is obtained. As described above, the lenticular sheet 30 typically has the plurality of convex cylindrical lenses 31 provided side by side (i.e., in a stripe manner), the lenses each having a semicircular section. When such lenticular sheet and the ribbon-shaped organic EL elements placed in a stripe manner are integrated so that the direction in which the convex cylindrical lenses 31 extend and the direction in which the ribbon-shaped organic EL elements 20 extend may be substantially parallel to each other, the light beams from the respective ribbon-shaped organic EL elements can appropriately interfere with each other by virtue of the lenticular sheet to eliminate the stripe pattern. As a result, the luminance unevenness can be suppressed in an extremely satisfactory manner.

The lines per inch (LPI) of the convex cylindrical lenses 31 are preferably 20 to 200, more preferably 40 to 180, still more preferably 60 to 160. When the lines per inch are less than 20, the interference is so strong that glare may occur. When the lines per inch exceed 200, the pattern of the organic EL elements is not eliminated and hence the luminance unevenness increases, in some cases.

An angle $\theta$ formed by a boundary (valley portion) between adjacent convex cylindrical lenses is preferably 35° to 60°. When the angle $\theta$ is less than 35°, the following problems may arise. The releasability of the lenticular sheet after its forming becomes insufficient and the lifetime of a die shortens. When the angle $\theta$ exceeds 60°, a lens function becomes insufficient, and as a result, brightness becomes insufficient in some cases.

The lenticular sheet 30 can be obtained by subjecting a thermoplastic resin to press molding or extrusion molding. Typical examples of the thermoplastic resin include a polyethylene terephthalate (PET), a polymethyl methacrylate (PMMA), and a cycloolefin polymer (COP). Alternatively, the lenticular sheet 30 may be formed by a UV curing forming method involving applying a UV-curable resin onto a base material made of, for example, a PET, a PMMA, a polyethylene (PE), a polypropylene (PP), or a polycarbonate (PC) and curing the resin while performing embossing.

The thickness of the lenticular sheet 30 (total of TL and TB) can be appropriately set as long as the effect of the present invention is obtained.

D. Adhesion Layer

The term "adhesion layer" as used herein refers to a layer that joins the surfaces of adjacent optical members to integrate the members with a practically sufficient adhesive strength for a practically sufficient adhesion time. A material for forming the adhesion layer 40 is, for example, a pressure-sensitive adhesive, an adhesive, or an anchor coating agent. The adhesion layer may be of such a multilayer structure that an anchor coat layer is formed on the surface of an adherend and an adhesive layer is formed on the layer. In addition, the adhesion layer may be such a thin layer as to be invisible to the naked eye (also referred to as "hair line").

The thickness of the adhesion layer can be appropriately set depending on the application. The thickness is preferably 2 μm to 50 μm, more preferably 2 μm to 40 μm, particularly preferably 5 μm to 35 μm. Setting the thickness within such range can provide an adhesion layer having appropriate adhesion.

The shear elastic modulus of the adhesion layer at 20° C. is preferably 30,000 Pa to 1,100,000 Pa, more preferably 40,000 Pa to 1,000,000 Pa, still more preferably 50,000 Pa to 900,000 Pa, particularly preferably 50,000 Pa to 90,000 Pa.

The transmittance of the adhesion layer measured at 23° C. for light having a wavelength of 590 nm is preferably 90% or more. A theoretical upper limit for the transmittance is 100% and a practical upper limit for the transmittance is 96%.

The gel fraction of the adhesion layer is preferably 75% or more, more preferably 75% to 90%, particularly preferably 80% to 85%. Setting the gel fraction within such range can provide an adhesion layer having a good pressure-sensitive adhesive characteristic. The gel fraction can be regulated by, for example, the kind and content of a cross-linking agent to be used.

The glass transition temperature (Tg) of the adhesion layer is preferably −70° C. to −10° C., more preferably −60° C. to −15° C., particularly preferably −50° C. to −20° C. Setting the glass transition temperature within such range can provide an adhesion layer having strong adhesion to the lenticular sheet.

The moisture content of the adhesion layer is preferably 1.0% or less, more preferably 0.8% or less, particularly preferably 0.6% or less, most preferably 0.4% or less. A theoretical lower limit for the moisture content is 0. Setting the moisture content within such range can provide an adhesion layer in which foaming hardly occurs even under a high-temperature environment.

The adhesion layer 40 is preferably formed of an acrylic pressure-sensitive adhesive. The acrylic pressure-sensitive adhesive preferably contains a (meth)acrylic polymer and a peroxide. The (meth)acrylic polymer refers to a polymer or copolymer synthesized from an acrylate-based monomer and/or a methacrylate-based monomer. When the (meth) acrylic polymer is a copolymer, the state of arrangement of its molecules is not particularly limited, and the copolymer may be a random copolymer, may be a block copolymer, or may be a graft copolymer. The state of arrangement of the molecules of the (meth)acrylic polymer is preferably random, i.e., the polymer is preferably a random copolymer.

Any appropriate peroxide can be used as the peroxide as long as the cross-linking of the (meth)acrylic polymer can be achieved by generating a radical through heating. Examples of the peroxide include hydroperoxides, dialkyl peroxides, peroxy esters, diacyl peroxides, peroxy dicarbonates, peroxy ketals, and ketone peroxides. The compounding amount of the peroxide is preferably 0.01 part by weight to 1 part by weight, more preferably 0.05 part by weight to 0.8 part by weight, particularly preferably 0.1 part by weight to 0.5 part by weight, most preferably 0.15 part by weight to 0.45 part by weight with respect to 100 parts by weight of the (meth) acrylic polymer. Setting the compounding amount of the peroxide within such a range can provide an adhesion layer having moderate stress relaxation property and excellent thermal stability.

EXAMPLES

Hereinafter, the present invention is specifically described by way of examples. However, the present invention is not limited by these examples. In addition, the terms "part(s)" and "%" in the examples refer to "part(s) by weight" and "wt %," respectively unless otherwise stated.

Example 1

1. Production of Ribbon-Shaped Organic EL Element

First, an SUS304 foil having a width of 300 mm, a length of 140 m, and a thickness of 25 μm was prepared as a material for a substrate. An insulating material (JEM-477 manufactured by JSR Corporation) was applied onto the SUS foil and then dried, followed by its post-baking at 220° C. for 1 hour to form a planarizing layer having a thickness of 1.5 μm.

Next, ITO as a reflecting layer-cum-first electrode (anode) was formed into a film (having a thickness of 110 nm) on the planarizing layer with a sputtering apparatus according to a predetermined pattern.

An insulating material (JEM-477 manufactured by JSR Corporation) was applied as an insulating layer onto the first electrode thus formed and then dried, followed by its exposure with a proximity exposure machine through a predetermined photomask. After that, the material was developed with 2.38% tetramethylammonium hydride (TMAH) and then washed with water. After that, moisture was removed and then the material was subjected to post-baking at 220° C. for 1 hour. Its thickness after the post-baking was about 1.5 μm. It should be noted that the insulating layer was of a pattern having an opening portion having a width of 20 mm and a length of 100 mm. After that, the laminate was cut along its lengthwise direction to be of a ribbon shape having a width of 22 mm and a length of 140 m.

The ribbon-shaped laminate obtained in the foregoing was subjected to a UV/O$_3$ treatment (surface modification treatment with UV light and ozone), and was then set in a vacuum deposition machine. In a vacuum, copper phthalocyanine (CuPC), N,N'-diphenyl-N—N-bis(1-naphthyl)-1,1'-(biphenyl)-4,4'-diamine (NPB), an 8-quinolinol aluminum complex (Alq3), lithium fluoride (LiF), and aluminum (Al) were deposited from the vapor to serve as a hole-transporting layer having a thickness of 25 nm, a light-emitting layer having a thickness of 50 nm, an electron-transporting layer having a thickness of 50 nm, an electron-injecting layer having a thickness of 0.5 nm, and a second electrode having a thickness of 100 nm, respectively. A nitrogen gas was introduced into the vacuum deposition machine to adjust the pressure in the machine to atmospheric pressure. After that, the laminate was moved to another chamber under a nitrogen atmosphere, and was then encapsulated by attaching a thin glass (manufactured by Nippon Electric Glass Co., Ltd.) through an epoxy-based adhesive. After the adhesive had been cured, the laminate was taken out to the air and then cut every 100 mm length to provide ribbon-shaped organic EL elements each measuring 7 mm by 100 mm.

2. Production of Surface Light Emitter

Figure 5:
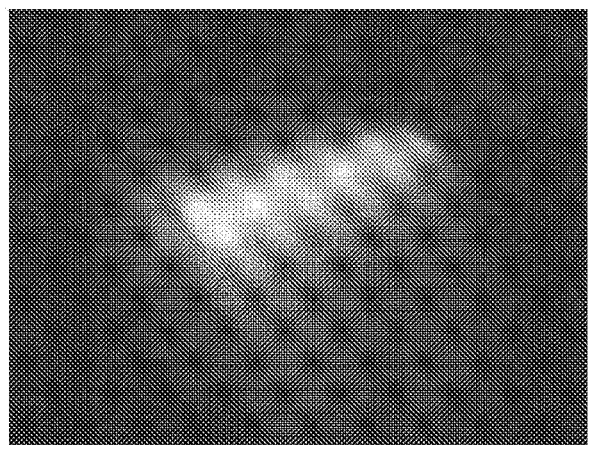
FIG. 5 is a photograph showing the light-emitting state of a surface light emitter of Example 1.

Three of the ribbon-shaped organic EL elements obtained in the foregoing were mounted on a glass base material measuring 30 mm by 100 mm at a pitch of 1 mm so as to be parallel to one another. An acrylic pressure-sensitive adhesive (having a thickness of 40 μm) was applied onto the base material on which the ribbon-shaped organic EL elements had been mounted, and then a lenticular sheet (manufactured by TEXNAI, trade name: 401pi-A3L) was integrated by being attached to the base material through the pressure-sensitive adhesive. Thus, a surface light emitter was obtained. The surface light emitter was obtained by attaching the base material on which the ribbon-shaped organic EL elements had been mounted and the lenticular sheet to each other so that the direction in which the ribbon-shaped organic EL elements extended and the direction in which the convex cylindrical lenses of the lenticular sheet extended were substantially parallel to each other. It should be noted that the thickness of the lenticular sheet was 2.08 mm and the LPI of the convex cylindrical lenses were 40. Further, the total thickness of the lenticular sheet and the adhesion layer made of the pressure-sensitive adhesive was 2.1 mm. FIG. 5 shows the light-emitting state of the resultant surface light emitter.

Example 2

A surface light emitter was produced in the same manner as in Example 1 except that the pitch X of the ribbon-shaped organic EL elements was set to 2 mm.

Example 3

A surface light emitter was produced in the same manner as in Example 1 except that the pitch X of the ribbon-shaped organic EL elements was set to 3 mm.

Example 4

A surface light emitter was produced in the same manner as in Example 1 except that: a 601pi-A3PG (thickness=1.17 mm, LPI=60) was used as a lenticular sheet; and the total thickness of the lenticular sheet and the adhesion layer was set to 1.2 mm.

Example 5

A surface light emitter was produced in the same manner as in Example 1 except that: a 601pi-TK-A3LG (thickness=0.37 mm, LPI=60) was used as a lenticular sheet; and the total thickness of the lenticular sheet and the adhesion layer was set to 0.4 mm.

Comparative Example 1

Figure 6:
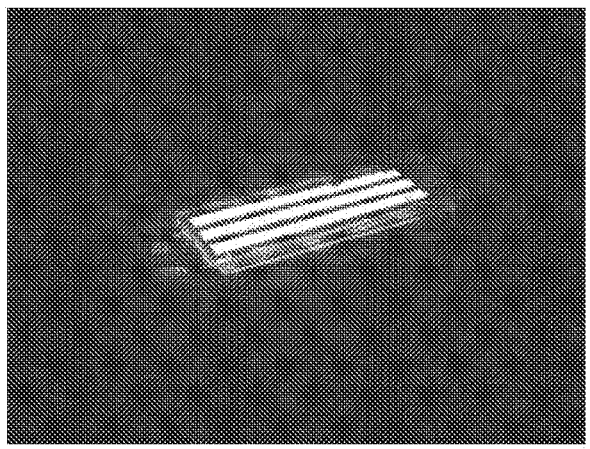
FIG. 6 is a photograph showing the light-emitting state of a surface light emitter of Comparative Example 1.

No lenticular sheet was used, and the base material on which the ribbon-shaped organic EL elements had been mounted of Example 1 was used as a surface light emitter without being treated. FIG. 6 shows the light-emitting state of the resultant surface light emitter.

Comparative Example 2

A surface light emitter was produced in the same manner as in Example 1 except that a prism sheet (BEF II 90/24 manufactured by 3M Company) was used instead of the lenticular sheet. It should be noted that the prism sheet is an optical member obtained by uniformly and accurately forming a prism pattern in an acrylic resin on the surface of a polyester film.

Comparative Example 3

A surface light emitter was produced in the same manner as in Example 1 except that an ordinary diffuser (D114 manufactured by TSUJIDEN CO., LTD.) was used instead of the lenticular sheet.

Comparative Example 4

A surface light emitter was produced in the same manner as in Example 1 except that the base material and the lenticular sheet were attached to each other so that the direction in which the ribbon-shaped organic EL elements extended and the direction in which the convex cylindrical lenses of the lenticular sheet extended were substantially perpendicular to each other.

<Evaluation of Surface Light Emitter for its Luminance Unevenness>

The luminance ($cd/m^2$) of each of the surface light emitters obtained in the examples and the comparative examples was measured with a luminance meter (BM-9 manufactured by TOPCON CORPORATION). A luminance ratio obtained from the following equation was used as an indicator of luminance unevenness.

Luminance ratio={luminance of non-light-emitting portion (portion where no organic EL element is placed)}/{luminance of central portion of light-emitting portion}

Further, the light-emitting state (presence or absence of unevenness) of each of the surface light emitters was visually observed. It should be noted that when the luminance ratio became smaller than 0.7, the luminance unevenness started to be visually recognized, and as the luminance ratio became smaller, the luminance unevenness enlarged and a stripe pattern started to be clearly recognized. Table 1 shows the results together with a relationship Y/X between the pitch X (mm) of the ribbon-shaped organic EL elements, and the total thickness Y (mm) of the lenticular sheet and the adhesion layer.

TABLE 1

| | | Pitch X (mm) | Total thickness Y (mm) | Y/X | Luminance ratio | Luminance unevenness | LPI |
|---|---|---|---|---|---|---|---|
| Example 1 | Lenticular sheet | 1 | 2.1 | 2.1 | 0.9 | Absent | 40 |
| Example 2 | Lenticular sheet | 2 | 2.1 | 1.1 | 0.8 | Absent | 40 |
| Example 3 | Lenticular sheet | 3 | 2.1 | 0.7 | 0.7 | Slight | 40 |
| Example 4 | Lenticular sheet | 1 | 1.2 | 1.2 | 0.9 | Absent | 60 |
| Example 5 | Lenticular sheet | 1 | 0.4 | 0.4 | 0.7 | Slight | 60 |
| Comparative Example 1 | Absent | 1 | — | — | 0 | Remarkable | — |
| Comparative Example 2 | Prism sheet | 1 | 2.1 | 2.1 | 0.3 | Remarkable | — |
| Comparative | Ordinary | 1 | 2.1 | 2.1 | 0.5 | Remarkable | — |

TABLE 1-continued

|  |  | Pitch X (mm) | Total thickness Y (mm) | Y/X | Luminance ratio | Luminance unevenness | LPI |
|---|---|---|---|---|---|---|---|
| Example 3 | diffuser |  |  |  |  |  |  |
| Comparative Example 4 | Lenticular sheet | 1 | 2.1 | 2.1 | 0 | Remarkable | 40 |

As is apparent from Table 1, and FIG. 5 and FIG. 6, the luminance unevenness was able to be satisfactorily prevented in each of the examples of the present invention, in which the ribbon-shaped organic EL elements and the lenticular sheet were attached to each other so that the direction in which the ribbon-shaped organic EL elements extended and the direction in which the convex cylindrical lenses extended were parallel to each other. In particular, the luminance unevenness was able to be prevented in an extremely satisfactory manner in each of Examples 1, 2, and 4, in which the pitch X (mm) of the ribbon-shaped organic EL elements, and the total thickness Y (mm) of the lenticular sheet and the adhesion layer satisfied a relationship of $Y \geq (\sqrt{3}/2) \times X$. As is apparent from FIG. 5, the surface light emitter of Example 1 uniformly emits light without causing any luminance unevenness. On the other hand, the luminance unevenness was remarkable in each of Comparative Examples 1 to 3, in which no lenticular sheet was used. As is apparent from FIG. 6, the stripe pattern of the organic EL elements clearly appeared in the surface light emitter of Comparative Example 1. Further, even when the lenticular sheet was used, the luminance unevenness was remarkable in Comparative Example 4 in which the base material and the lenticular sheet were attached to each other so that the direction in which the ribbon-shaped organic EL elements extended and the direction in which the convex cylindrical lenses extended were perpendicular to each other.

INDUSTRIAL APPLICABILITY

The surface light emitter of the present invention can be suitably used in, for example, lighting equipment, a backlight for a liquid crystal display apparatus, a light-emitting part for display decoration, or a digital signage.

REFERENCE CHARACTERS LIST 10 base material
20 ribbon-shaped organic EL element
21 substrate
22 first electrode
23 organic EL layer
23a hole-injecting layer
23b hole-transporting layer
23c light-emitting layer
23d electron-transporting layer
23e electron-injecting layer
24 second electrode
25 encapsulating layer
30 lenticular sheet
31 convex cylindrical lens
40 adhesion layer
100 surface light emitter

The invention claimed is:

1. A surface light emitter, comprising:
a base material;
a plurality of ribbon-shaped organic electroluminescent elements formed side by side and over the base material; and
a lenticular sheet formed over the ribbon-shaped organic electroluminescent elements through an adhesion layer, and having a plurality of convex cylindrical lenses provided side by side,
wherein a direction in which the convex cylindrical lenses extend and a direction in which the ribbon-shaped organic electroluminescent elements extend are substantially parallel to each other, and
wherein a width of each of the ribbon-shaped organic electroluminescent elements is 5 mm to 100 mm, and a ratio of a width of each of the convex cylindrical lenses to the width of each of the ribbon-shaped organic electroluminescent elements is 1/10 to 1/10,000.

2. The surface light emitter according to claim 1, wherein a length of each of the ribbon-shaped organic electroluminescent elements is 50 mm to 2,000 mm.

3. The surface light emitter according to claim 1, wherein lines per inch of the convex cylindrical lenses are 20 to 200.

4. The surface light emitter according to claim 1, wherein an angle θ formed by a boundary between adjacent convex cylindrical lenses is 35° to 60°.

5. The surface light emitter according to claim 1, wherein 150 to 250 of the convex cylindrical lenses are placed at a position corresponding to each of the ribbon-shaped organic electroluminescent elements.

6. The surface light emitter according to claim 1, wherein an interval X (mm) between adjacent elements in the plurality of ribbon-shaped organic electroluminescent elements, and a total thickness Y (mm) of the lenticular sheet and the adhesion layer satisfy the following expression (1):

$$Y \geq (\sqrt{3}/2) \times X \tag{1}$$

7. The surface light emitter according to claim 6, wherein the interval X is 1 mm to 10 mm.

8. The surface light emitter according to claim 1, which is usable for one selected from the group consisting of a lighting equipment, a light-emitting part for display decoration, and a digital signage.

* * * * *